United States Patent
Ono et al.

(10) Patent No.: US 7,896,657 B2
(45) Date of Patent: Mar. 1, 2011

(54) CIRCUIT DEVICE, CIRCUIT DEVICE MANUFACTURING METHOD AND CONNECTING MEMBER

(75) Inventors: Masahiro Ono, Kanagawa (JP);
 Hiroyuki Suzuki, Kanagawa (JP);
 Haruo Hayakawa, Kanagawa (JP);
 Iwao Matuura, Kanagawa (JP); Akihiro Miyashita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/442,341

(22) PCT Filed: Sep. 22, 2006

(86) PCT No.: PCT/JP2006/318882
 § 371 (c)(1),
 (2), (4) Date: Jul. 31, 2009

(87) PCT Pub. No.: WO2008/035442
 PCT Pub. Date: Mar. 27, 2008

(65) Prior Publication Data
 US 2009/0311884 A1  Dec. 17, 2009

(51) Int. Cl.
 *H01R 12/00* (2006.01)
 *H05K 1/00* (2006.01)
(52) U.S. Cl. ........................................ 439/65

(58) Field of Classification Search ............ 439/65, 439/66, 71, 91, 591
See application file for complete search history.

(56) References Cited

U.S. PATENT DOCUMENTS

| | | | |
|---|---|---|---|
| 5,346,402 A * | 9/1994 | Yasuho et al. | 439/71 |
| 7,613,010 B2 * | 11/2009 | Ono et al. | 361/784 |
| 2005/0168961 A1 * | 8/2005 | Ono et al. | 361/784 |
| 2010/0008056 A1 * | 1/2010 | Ono et al. | 361/784 |

FOREIGN PATENT DOCUMENTS

| | | |
|---|---|---|
| JP | 6/61415 A | 3/1994 |
| JP | 2001-338567 A | 12/2001 |
| JP | 2005-217348 A | 8/2005 |

* cited by examiner

*Primary Examiner* — Javaid Nasri
(74) *Attorney, Agent, or Firm* — Seed IP Law Group PLLC

(57) ABSTRACT

A circuit device which can form terminal portions at narrow pitches a manufacturing method of the circuit device, and a connecting member are provided. A circuit device 10 includes: a first printed circuit board 11 and a second printed circuit board 15 which are arranged along the thickness direction of substrates 12, 16; and a connecting member 20 which is interposed between the first printed circuit board 11 and the second printed circuit board 15. The first printed circuit board 11 and the second printed circuit board 15 are electrically connected with each other by terminal portions 21 formed on the connecting member 20. The circuit device 10 integrally forms the terminal portions 21 on a frame body 25 by plating.

7 Claims, 4 Drawing Sheets

CIRCUIT DEVICE, CIRCUIT DEVICE MANUFACTURING METHOD AND CONNECTING MEMBER

TECHNICAL FIELD

The present invention relates to a circuit device which interposes a connecting member between a first printed circuit board and a second printed circuit board and electrically connects the first printed circuit board and the second printed circuit board with each other by terminal portions formed on the connecting member, a manufacturing method of the circuit device, and the connecting member.

BACKGROUND ART

Conventionally, there has been known a circuit device in which a plurality of printed circuit boards are arranged in a stacked manner in the thickness direction of the substrate, and respective printed circuit boards are electrically connected with each other via a connecting member interposed between the respective printed circuit boards (see patent document 1).

In the constitution disclosed in patent document 1, a connecting member has an approximately quadrangular frame body having insulation property, and a large number of terminal portions are inserted into a frame body at predetermined intervals such that the terminal portions intersect the continuous direction of the frame body and are bent.

According to patent document 1, the terminal portions are formed on the frame body by insert molding and hence, the disclosure of the patent document 1 acquires an excellent advantage that the respective terminal portions can be positioned with high accuracy.

Patent document 1: Japanese Patent No. 3232723

DISCLOSURE OF THE INVENTION

Task to be Solved by the Invention

Recently, with respect to a connecting member used in a circuit device, along with the enhancement of high-package mounting of electronic parts on a printed circuit board, the connecting member is requested to satisfy a demand for the arrangement of respective terminal portions at narrower pitches.

However, in patent document 1, the terminal portions are formed on the frame body by insert molding and hence, narrowing of the pitches of the terminal portions is limited so that there has been a demand for an alternative idea which can cope with the enhancement of high-package mounting of electronic parts on a printed circuit board.

The present invention has been made to satisfy the above-mentioned conventional demands, and it is an object of the present invention to provide a circuit device which can form a plurality of terminal portions at narrow pitches, a manufacturing method of the circuit device, and a connecting member.

Means for Solving the Task

An aspect of the present invention is directed to a circuit device which includes: a first printed circuit board and a second printed circuit board which are arranged along a thickness direction of a substrate; and a connecting member which is interposed between the first printed circuit board and the second printed circuit board, the first printed circuit board and the second printed circuit board being electrically connected with each other by terminal portions formed on a frame body of the connecting member, wherein the terminal portions are integrally formed on the frame body by plating to the frame body.

Here, to form a large number of terminal portions which are formed in an approximately U shape using a metal wire by bending, for example, on the frame body at predetermined intervals by insert molding, it is necessary to ensure a distance between the neighboring terminal portions to some extent.

For this end, according to the aspect of the present invention, the terminal portions are integrally formed on the frame body by plating and hence, it is possible to suppress the distance between the neighboring terminal portions as small as possible.

Accordingly, it is possible to arrange the terminal portions at narrow pitches thus allowing the circuit device to cope with the enhancement of high-density packaging of the printed circuit board.

The present invention has also an aspect characterized in that the terminal portion is constituted of a first terminal portion which is connectable to a circuit pattern of the first printed circuit board, a second terminal portion which is connectable to a circuit pattern of the second printed circuit board, and a connecting portion which connects the first terminal portion and the second terminal portion thus having a U-shaped cross section, and a shield electrode is formed on a side surface of the frame body along the arrangement direction of the first printed circuit board and the second printed circuit board.

The terminal portion is formed into an approximately U-shaped cross section due to the connecting portion which connects the first terminal portion and the second terminal portion and, at the same time, the shield electrode is formed on the frame body and hence, it is unnecessary to additionally provide a metal frame for shielding.

Further, the present invention has an aspect characterized in that the shield electrode is formed on a projecting portion which is formed on the side surface of the frame body.

Here, the frame body is usually formed of a resin molded product, and a circular gate for injecting a resin is formed at a position corresponding to the side surface of the frame body. Accordingly, when the frame body is formed by injection molding, a resin in the gate remains on the side surface of the frame body as a cylindrical runner. The remaining runner is cut after performing injection molding.

Recently, however, along with a demand for a more compact connecting member, a thickness of the frame body is decreased. Along with the decrease of the thickness of the frame body, the use of the circular gate becomes difficult.

That is, when the thickness of the frame body is decreased, a diameter of the gate is decreased so that it is difficult for the gate to ensure a cross-sectional area whereby it is difficult to smoothly inject a resin into the inside of a cavity.

Accordingly, recently, a shape of the gate is changed from the circular shape to a laterally-elongated rectangular shape thus arranging the laterally-elongated rectangular gate along the side surface of the frame body. A resin in the inside of the gate remains on the side surface of the frame body as a box-shaped projecting portion (runner).

In view of the above, according to an aspect of the present invention, by making use of the box-shaped projecting portion formed on the side surface of the frame body, the shield electrode is formed on the projecting portion.

Due to such constitution, the small-sizing of the frame body can be realized by suppressing the thickness of the frame body as small as possible and, at the same time, it is possible to smoothly inject the resin into the cavity at the time of forming the frame body by injection molding.

In addition to such advantages, by forming the shield electrode using the projecting portion (runner) which remains on the side surface of the frame body, it is possible to omit a step of removing the projecting portion (runner) by cutting.

Further, an aspect of the present invention is also directed to a manufacturing method of a circuit device which includes a first printed circuit board and a second printed circuit board which are arranged along a thickness direction of a substrate, and a connecting member which is interposed between the first printed circuit board and the second printed circuit board, and the first printed circuit board and the second printed circuit board being electrically connected with each other by terminal portions formed on a frame body of the connecting member, wherein the terminal portions are integrally formed on the frame body by plating to the frame body.

Here, for example, in forming the terminal portions in a U shape by bending and forming a large number of these terminal portions on the frame body at predetermined intervals by insert molding, it is necessary to hold the large number of terminal portions in the inside of a cavity and hence, there exists a possibility that an injection molding mold has the complicated structure.

Further, since the large number of terminal portions is held in the inside of the cavity, it is necessary to provide the structure which ensures the smooth flow of a resin at the time of performing injection molding.

For this end, according to the manufacturing method of a circuit device of the aspect of the present invention, the terminal portions are formed on the frame body by applying plating to the frame body. Due to such plating, it is no more necessary to hold the large number of terminal portions in the inside of the cavity thus simplifying the structure of the injection molding mold.

Further, since it is unnecessary to hold the large number of terminal portions in the inside of the cavity, it is possible to easily ensure the smooth flow of the resin at the time of performing injection molding.

Further, an aspect of the present invention is also directed to a connecting member which is interposed between a first printed circuit board and a second printed circuit board which are arranged along a thickness direction of a substrate, and electrically connects the first printed circuit board and the second printed circuit board by the terminal portions formed on a frame body, wherein the terminal portions are integrally formed on the frame body by applying plating to the frame body.

ADVANTAGE OF THE INVENTION

According to the present invention, by integrally forming the terminal portions on the frame body by plating, it is possible to form the terminal portions at narrow pitches thus providing the circuit device which can favorably cope with high-density packaging of the printed circuit board.

DESCRIPTION OF THE REFERENCE NUMERALS AND SIGNS

Figure 1:
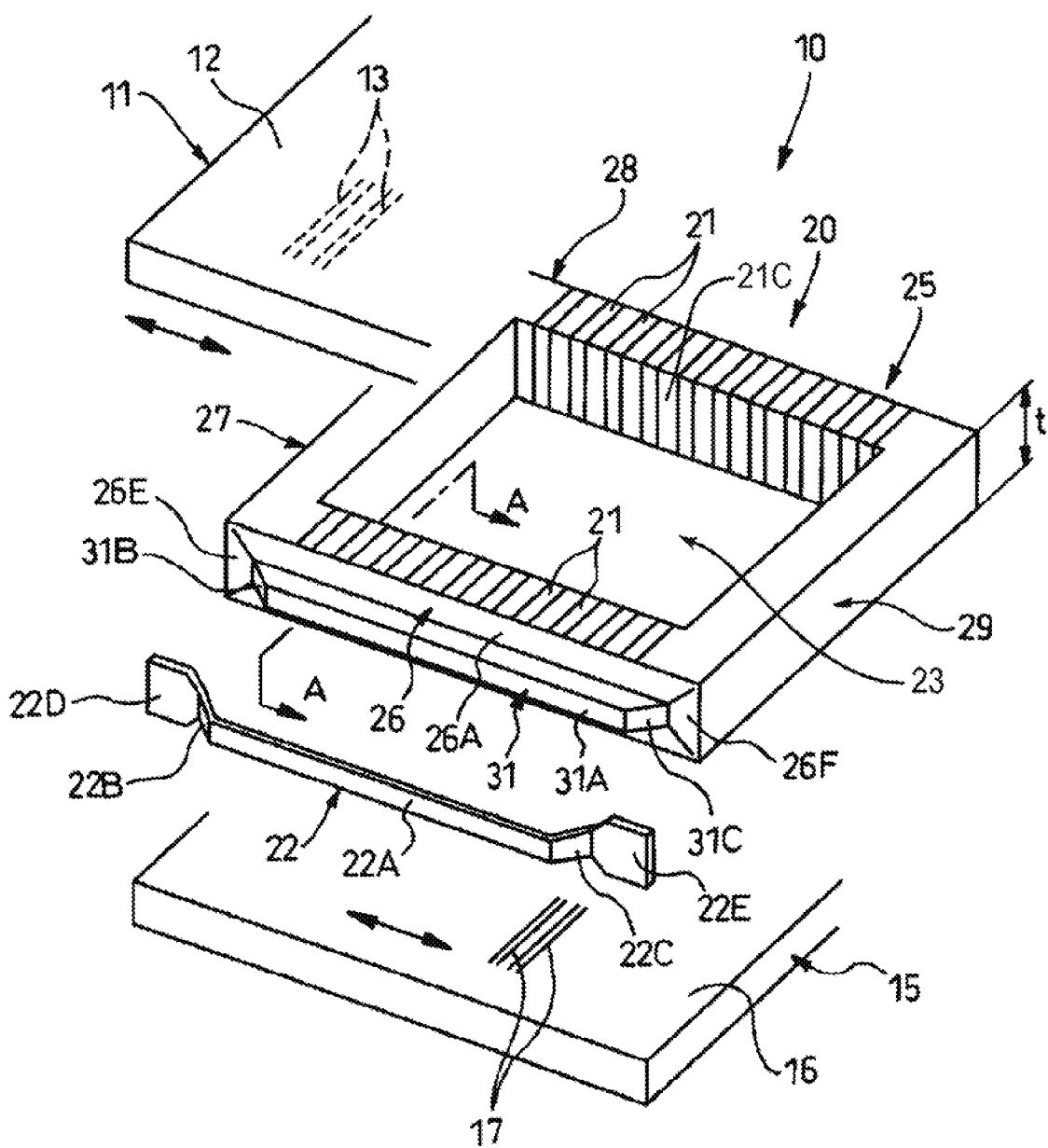
FIG. 1 is an exploded perspective view showing a first embodiment of a circuit device according to the present invention.

10, 40, 50, 60, 70: circuit device
11: first printed circuit board
12: first substrate (substrate)
13: first circuit pattern (circuit pattern)
15: second printed circuit board
16: second substrate (substrate)
17: second circuit pattern (circuit pattern)
20: connecting member
21, 41, 51, 61, 70: terminal portion
21A, 41A, 51A, 61A, 70A: first terminal portion
21B, 41B, 51B, 61B, 70B: second terminal portion
21C, 41C, 51C, 70C: connecting portion
22, 42: shield electrode
25: frame body
26A: outer side surface (side surface)
31: projecting portion
61C: inner side connecting portion (connecting portion)
61D: outer side connecting portion (connecting portion)

BEST MODE FOR CARRYING OUT THE INVENTION

First Embodiment

Hereinafter, a circuit device according to an embodiment of the present invention is explained in conjunction with drawings.

Figure 2:
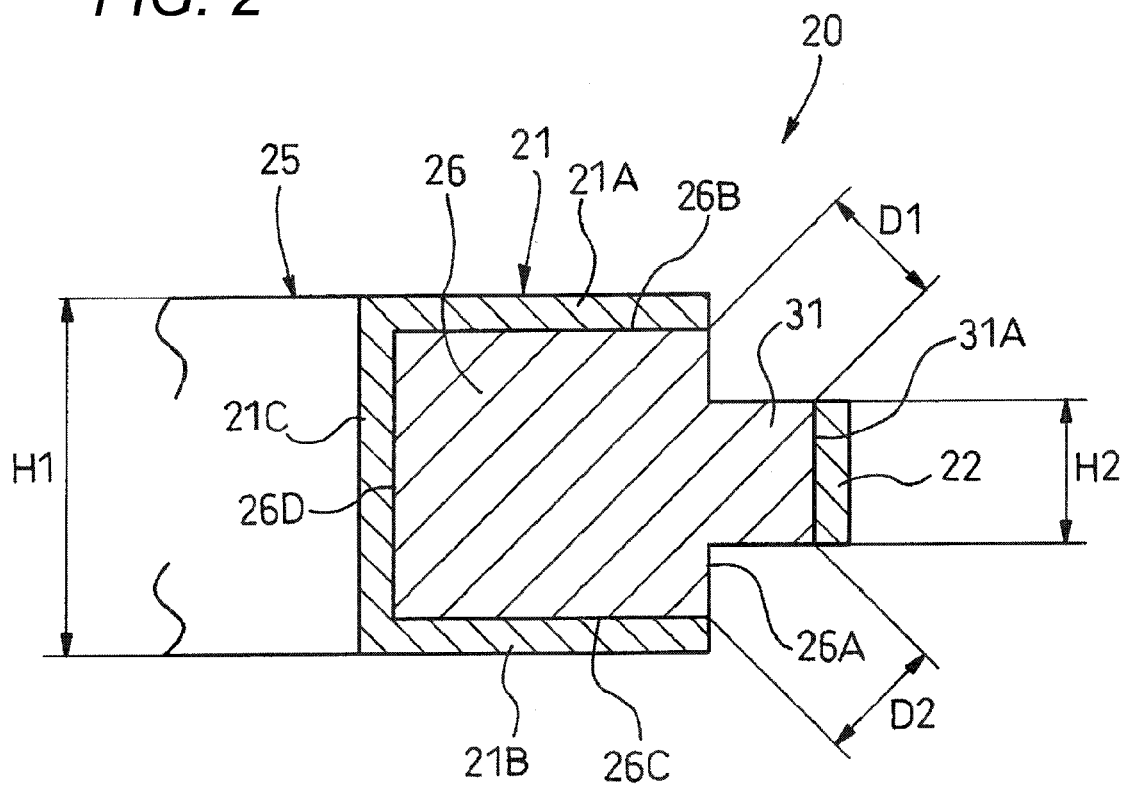
FIG. 2 is a cross-sectional view taken along a line A-A in FIG. 1.

As shown in FIG. 1 and FIG. 2, a circuit device 10 of a first embodiment includes a first printed circuit board 11 and a second printed circuit board 15 which are arranged along the thickness direction of a first substrate (or, merely "substrate") 12 and a second substrate (or, merely "substrate") 16, and a connecting member 20 which is interposed between the first printed circuit board 11 and the second printed circuit board 15. The first printed circuit board 11 and the second printed circuit board 15 are electrically connected with each other by a large number of terminal portions 21 formed on the connecting member 20, and a shield electrode 22 is mounted on the connecting member 20.

The first printed circuit board 11 forms a first circuit pattern (or, merely "circuit pattern") 13 on the first substrate 12 and also mounts electronic parts (not shown in the drawing) on the first substrate 12.

The second printed circuit board 15 forms a second circuit pattern (or, merely "circuit pattern") 17 on the second substrate 16 and also mounts electronic parts (not shown in the drawing) on the second substrate 16.

The connecting member 20 includes a substantially rectangular-shaped frame body 25 which is formed of first to fourth beam members 26 to 29, a large number of terminal portions 21 which are formed on the oppositely-facing first beam member 26 and second beam member 28 out of these beam members of the frame body 25, and the shield electrode 22 which is mounted on a side surface of the first beam member 26.

The frame body 25 is a member which is formed in a substantially rectangular frame shape by performing injection molding using a resin such as LCP (liquid crystal polymer) or PPA (poly-phthalamide) as a material. A projecting portion 31 is formed on an outer side surface (side surface) 26A of the first beam member 26 out of four beam members 26 to 29.

The first to fourth beam members 26 to 29 are respectively have a substantially rectangular cross section and define an opening 23. The projecting portion 31 is formed in a laterally-elongated rectangular box shape, and is formed along the outer side surface 26A of the first beam member 26. Accordingly, the projecting portion 31 can ensure a large length.

Here, the projecting portion 31 is formed of a resin which is left in the inside of a gate (not shown in the drawing) at the time of forming the frame body 25 by injection molding, and the projecting portion 31 remains on the outer side surface 26A of the first beam member 26.

Here, the gate is a flow passage through which a molten resin is introduced into a cavity at the time of forming the frame body 25 by injection molding.

The gate is formed in a laterally-elongated rectangular box shape. The gate is arranged along the outer side surface 26A of the first beam member 26 and hence, the gate can ensure a large length.

Due to such constitution, even when a thickness t of the frame body 25 is suppressed to a small value, the gate can easily ensure a cross-sectional area thereof. Accordingly, at the time of forming the frame body 25 by injection molding, the molten resin can be smoothly introduced into the cavity from the gate.

As described above, by forming the projecting portion 31 in a laterally-elongated rectangular box shape, the thickness t of the frame body 25 can be suppressed to a small value thus realizing the small-sizing of the frame body 25.

By applying plating to the oppositely-facing first and third beam members 26, 28 out of the respective beam members of the frame body 25, the terminal portions 21 are integrally formed on the first and third beam members 26, 28.

Here, the terminal portions 21 which are formed on the first beam member 26 and the terminal portions 21 which are formed on the third beam member 28 have the same constitution and hence, hereinafter, the explanation is made with respect to the terminal portions 21 formed on the first beam member 26, and the explanation of the terminal portions 21 formed on the third beam member 28 is omitted.

As shown in FIG. 2, each terminal portion 21 is constituted of a first terminal portion 21A which is connectable to the first circuit pattern 13 of the first printed circuit board 11 (see FIG. 1) a second terminal portion 21B which is connectable to the second circuit pattern 17 of the second printed circuit board 15 (see FIG. 1), and a connecting portion 21C which connects the first terminal portion 21A and the second terminal portion 21B with each other thus forming an approximately U shape.

The terminal portions 21 are formed using a material such as gold plating, copper plating or nickel.

The first terminal portions 21A are formed on an upper surface 26B of the first beam member 26 by plating. She second terminal portions 21B are formed on a lower surface 26C of the first beam member 26 by plating. The connecting portions 21C are formed on an inner side surface 26D of the first beam member 26 by plating.

Accordingly, by mounting the first printed circuit board 11 on an upper surface of the connecting member 20, the first circuit pattern 13 of the first printed circuit board 11 is connected to the first terminal portions 21A.

Further, by mounting the second printed circuit board 15 on a lower surface of the connecting member 20, the second circuit pattern 17 of the second printed circuit board 15 is connected to the second terminal portions 21B.

As described above, by integrally forming the terminal portions 21 on the first beam member 26 by plating, it is possible to suppress an interval between the neighboring terminal portions 21, 21 as small as possible.

Due to such constitution, the large number of terminal portions 21 can be formed on the frame body 25 at narrow pitches thus allowing the circuit device to favorably cope with the enhancement of high-density packaging of the first printed circuit board 11 and the second printed circuit board 15.

As shown in FIG. 1, the shield electrode 22 is arranged along the arrangement direction of the first printed circuit board 11 and the second printed circuit board 15 of the frame body 25 (direction indicated by an arrow) and the shield electrode 22 which is arranged in such a manner is mounted on the projecting portion 31.

The projecting portion 31 is mounted on the outer side surface 26A of the first beam member 26

To be more specific, the shield electrode 22 is configured such that a laterally-elongated rectangular shield 22A is formed on a top surface 31A of the projecting portion 31 by plating, side shields 22B, 22C are respectively formed on both side surfaces 31B, 31C of the projecting portion 31 by plating and both end shields 22D, 22E are respectively formed on both end portions 26E, 26F of the outer side surface 26A of the first beam member 26 by plating.

One side shield 2213 is integrally formed on one end of the laterally-elongated rectangular shield 22A, and one end shield 22D is integrally formed on one side shield 22B.

Another side shield 22C is integrally formed on another end of the laterally-elongated rectangular shield 22A, and another end shield 22E is integrally formed on another side shield 22C.

Here, the shield electrode 22 is formed using a material such as gold plating copper plating or nickel.

The terminal portions 21 and the shield electrode 22 may be formed by for example, vapor deposition or sheet metal working besides plating. Further, whether the terminal portions 21 and the shield electrode 22 are formed integrally with the frame body or formed separately from the frame body does not matter.

As described above, by providing the shield electrode 22 by making use of the projecting portion (runner) 31 which remains on the outer side surface 26A of the first frame member 26, it is unnecessary to additionally provide a metal frame for shielding.

Further, by providing the shield electrode 22 by making use of the projecting portion (runner) 31 which remains on the outer side surface 26A of the first frame member 26, it is possible to omit a step of removing the projecting portion (runner) 31 by cutting.

Here, as shown in FIG. 2 as one example, a height H1 of the connecting portion 21C of the terminal portion 21 is set to 0.6 mm.

Further, as one example, a height 112 of the laterally-elongated rectangular shield 22A of the shield electrode 22 is set to 0.35 to 0.4 mm.

Further, a distance D1 between the first terminal portion 21A of the terminal portion 21 and an upper end of the laterally-elongated rectangular shield 22A is set to a value whose lower limit is 0.2 mm, as one example.

A distance D2 between the second terminal portion 21B of the terminal portion 21 and a lower end of the laterally-elongated rectangular shield 22a is set to a value whose lower limit is 0.2 mm, as one example.

In this manner, by setting the distance D1 between the first terminal portion 21A and the laterally-elongated rectangular shield 22A to the value whose lower limit is 0.2 mm and by setting the distance D2 between the second terminal portion 21B and the laterally-elongated rectangular shield 22A to the value whose lower limit is 0.2 mm, it is possible to prevent short-circuiting between the first terminal portion 21A and the laterally-elongated rectangular shield 22A and short-circuiting between the second terminal portion 21B and the laterally-elongated rectangular shield 22A.

Next, a manufacturing method of a circuit device 10 is explained.

According to the manufacturing method of the circuit device 10, a large number of terminal portions 21 can be formed on the frame body 25 by applying plating to the frame body 25 and hence, at the time of forming the frame body 25 by injection molding, it is unnecessary to hold a large number of terminal portions 21 in the inside of the cavity of the injection molding mold.

It is unnecessary to hold a large number of terminal portions 21 in the inside of the cavity and hence, the injection molding mold can be simplified.

Further, it is unnecessary to hold a large number of terminal portions 21 in the inside of the cavity and hence, it is possible to easily ensure a smooth flow of molten resin at the time of performing injection molding.

In this manner, in manufacturing the circuit device 10, a large number of terminal portions 21 can be formed on the frame body 25 at narrow pitches by applying plating to the frame body 25.

Hereinafter, the second to fifth embodiments are explained in conjunction with FIG. 3 to FIG. 6. In the second to fifth embodiments, parts identical to or similar to the parts of the circuit device 10 of the first embodiment are given same symbols and their explanation is omitted.

Second Embodiment

Figure 3:
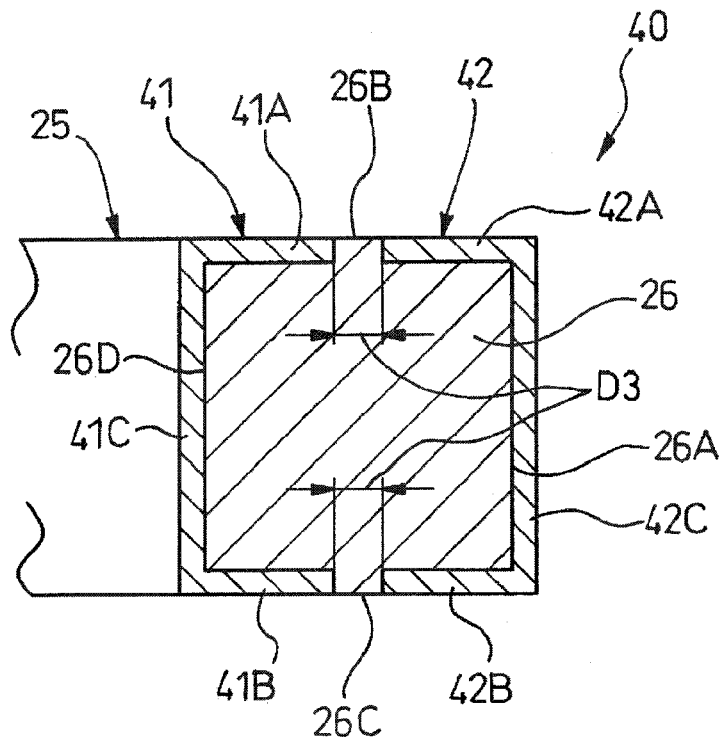
FIG. 3 is a cross-sectional view showing a second embodiment of a circuit device according to the present invention.

A circuit device 40 of the second embodiment shown in FIG. 3 is configured such that terminal portions 41 and a shield electrode 42 are provided in place of the terminal portions 21 and the shield electrode 22 in the first embodiment. The circuit device 40 of this embodiment is substantially equal to the circuit device 10 of the first embodiment with respect to other constitutions.

Each terminal portion 41 is constituted of a first terminal portion 41A which is connectable to the first circuit pattern 13 of the first printed circuit board 11 (see FIG. 1), a second terminal portion 41B which is connectable to the second circuit pattern 17 of the second printed circuit board 15 (see FIG. 1), and a connecting portion 41C which connects the first terminal portion 41A and the second terminal portion 41B with each other thus forming an approximately U shape.

The first terminal portions 41A are formed on an inner-side-surface-26D side of an upper surface 26B of the first beam member 26 by plating. The second terminal portions 41B are formed on an inner-side-surface-26D side of a lower surface 26C of the first beam member 26 by plating. The connecting portions 41C are formed on an inner side surface 26D of the first beam member 26 by plating.

The terminal portions 41 are formed using a material such as gold plating copper plating or nickel in the same manner as the terminal portions 21.

A shield electrode 42 is configured such that a first terminal portion 42A is formed on an outer-side-surface-26A side of the upper surface 26B of the first beam member 26 by plating, a second terminal portion 42B is formed on an outer-side-surface-26A side of the lower surface 26C of the first beam member 26 by plating, and a connecting portion 42C is formed on the outer side surface 26A of the first beam member 26 by plating thus forming an approximately U shape.

By setting a distance D3 between the terminal portion 41 and the shield electrode 42 to a value whose lower limit is 0.2 mm, it is possible to prevent short-circuiting between the terminal portion 41 and the shield electrode 42.

Here, the terminal portions 41 and the shield electrode 42 may be formed by, for example, vapor deposition or sheet metal working besides plating. Further, whether the terminal portions 41 and the shield electrode 42 are formed integrally with the frame body or formed separately from the frame body does not matter.

The circuit device 40 of the second embodiment can acquire advantageous effects substantially equal to the advantageous effects of the circuit device 10 of the first embodiment.

In addition to such advantageous effects, according to the circuit device 40 of the second embodiment, the shield electrode 42 is formed in an approximately U-shaped cross section by the first terminal portion 42A, the second terminal portion 42B and the connecting portion 42C and hence, the first printed circuit board 11 and the second printed circuit board 15 can be connected with each other with a shortest distance thus allowing the circuit device 40 to acquire high shielding property.

Third Embodiment

Figure 4:
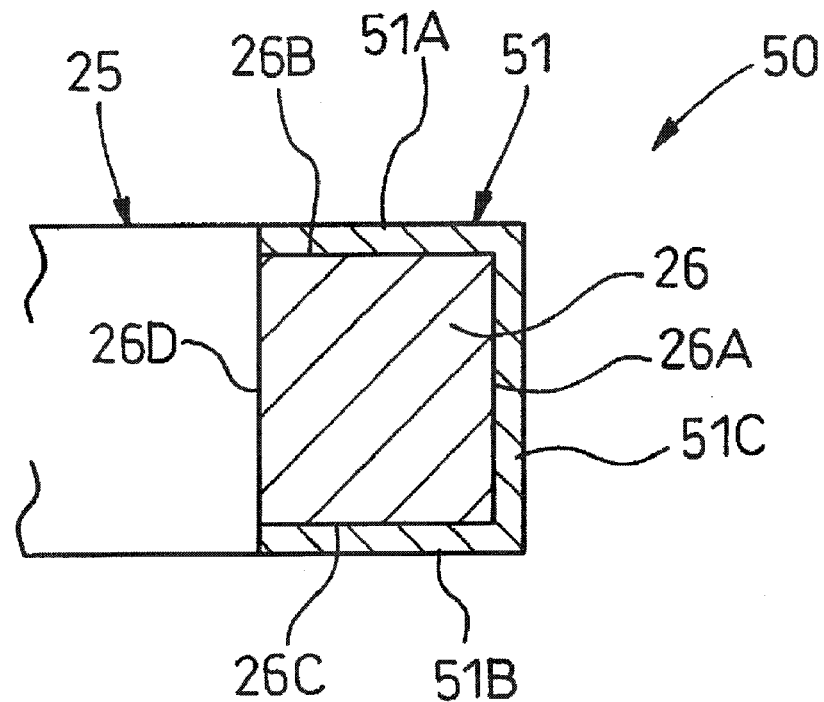
FIG. 4 is a cross-sectional view showing a third embodiment of a circuit device according to the present invention.

A circuit device 50 of the third embodiment shown in FIG. 4 is configured such that terminal portions 51 are provided in place of the terminal portions 21 in the first embodiment. The circuit device 50 of this embodiment is substantially equal to the circuit device 10 of the first embodiment with respect to other constitutions.

Here, the circuit device 50 is not provided with a shield electrode.

Each terminal portion 51 is constituted of a first terminal portion 51A Which is connectable to a first circuit pattern 13 of a first printed circuit board 11 (see FIG. 1) a second terminal portion 51B which is connectable to a second circuit pattern 17 of a second printed circuit board 15 (see FIG. 1) and a connecting portion 51C which connects an outer end portion of the first terminal portion 51A and a outer end portion of the second terminal portion 51B thus forming an approximately U shape.

The first terminal portions 51A are formed on an upper surface 26B of the first beam member 26 by plating. The second terminal portions 51B are formed on a lower surface 26C of the first beam member 26 by plating. The connecting portions 51C are formed on an outer side surface 26A of the first beam member 26 by plating.

The terminal portions 51 are formed using a material such as gold plating, copper plating or nickel in the same manner as the terminal portions 21.

The circuit device 50 of the third embodiment can acquire advantageous effects substantially equal to the advantageous effects of the circuit device 10 of the first embodiment.

In addition to such advantageous effects according to the circuit device 50 of the third embodiment, the terminal portion 51 is formed in an approximately U-shaped cross section by the first terminal portion 51A, the second terminal portion 51B and the connecting portion 51C and hence a contact area of the first terminal portions 51A with the first printed circuit board 11 and a contact area of the second terminal portion 51B with the second printed circuit board 15 can be increased thus enhancing a soldering strength of the first terminal portions 51A and the second terminal portions 51B with the first printed circuit board 11 and the second printed circuit board 15.

Fourth Embodiment

Figure 5:
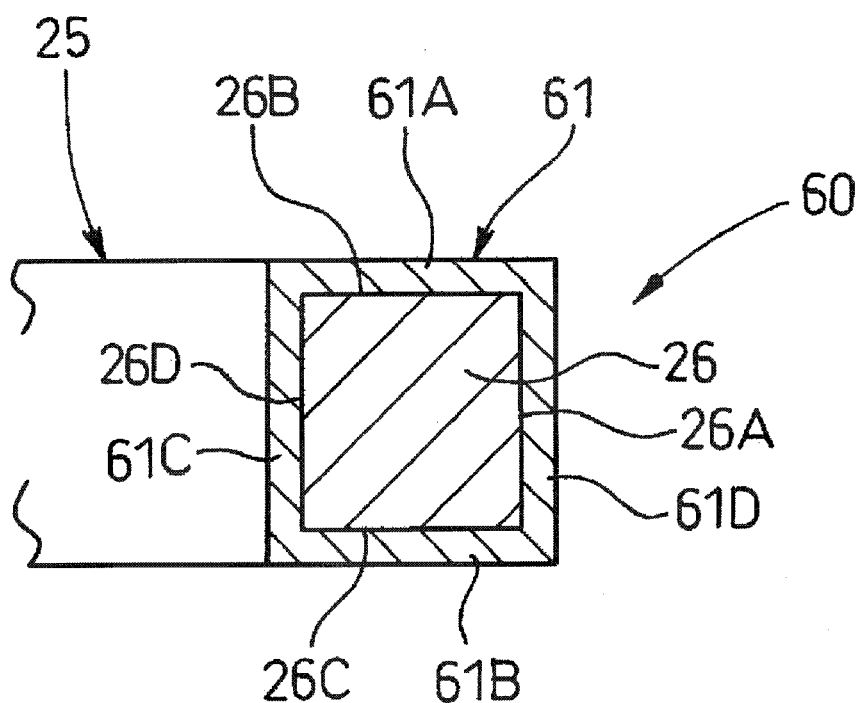
FIG. 5 is a cross-sectional view showing a fourth embodiment of a circuit device according to the present invention.

A circuit device 60 of the third embodiment shown n FIG. 5 is configured such that terminal portions 61 are provided in place of the terminal portions 21 in the first embodiment. The circuit device 60 of this embodiment is substantially equal to the circuit device 10 of the first embodiment with respect to other constitutions.

Here, the circuit device 60 is not provided with a shield electrode

Each terminal portion 61 is constituted of a first terminal portion 61A which is connectable to a first circuit pattern 13 of a first printed circuit board 11 (see FIG. 1), a second terminal portion 61B which is connectable to a second circuit pattern 17 of a second printed circuit board 15 (see FIG. 1), an inner side connecting portion (connecting portion) 61C which connects an inner end portion of the first terminal portion 61A ad an inner end portion of the second terminal portion 61B, and an outer side connecting portion (connecting portion) 61D which connects an outer end portion of the first terminal portion 61A and an outer end portion of the second terminal portion 61B thus forming an approximately U shape.

The first terminal portions 61A are formed on an upper surface 26B of the first beam member 26 by plating. The second terminal portions 61B are formed on a lower surface 26C of the first beam member 26 by plating. The inner side connecting portions 61C are formed on an inner side surface 26D of the first beam member 26 by plating. The outer side connecting portions 61C are formed on an outer side surface 26A of the first beam member 26 by plating.

The terminal portions 61 are formed using a material such as gold plating, copper plating or nickel in the same manner as the terminal portions 21

The circuit device 60 of the fourth embodiment can acquire advantageous effects substantially equal to the advantageous effects of the circuit device 10 of the first embodiment.

In addition to such advantageous effects, according to the circuit device 60 of the fourth embodiment, each terminal portion 61 is formed by the first terminal portion 61A, the second terminal portion 61B, the inner side connecting portion (connecting portion) 61C, and the outer side connecting portion (connecting portion) 61D. Accordingly, in the same manner as the above-mentioned third embodiment, a soldering strength of the first terminal portions 61A with the first printed circuit board 11 and a soldering strength of the second terminal portions 61B with the second printed circuit board 15 can be enhanced. Further, according to the circuit device 60 of the fourth embodiment, the terminal portion 61 has an approximately rectangular hollow shape. In other words, the terminal portion 61 has no edge portions. Accordingly, a possibility that the terminal portion 61 is peeled off from the first beam member 26 from the edge portion as a start point.

Fifth Embodiment

Figure 6:
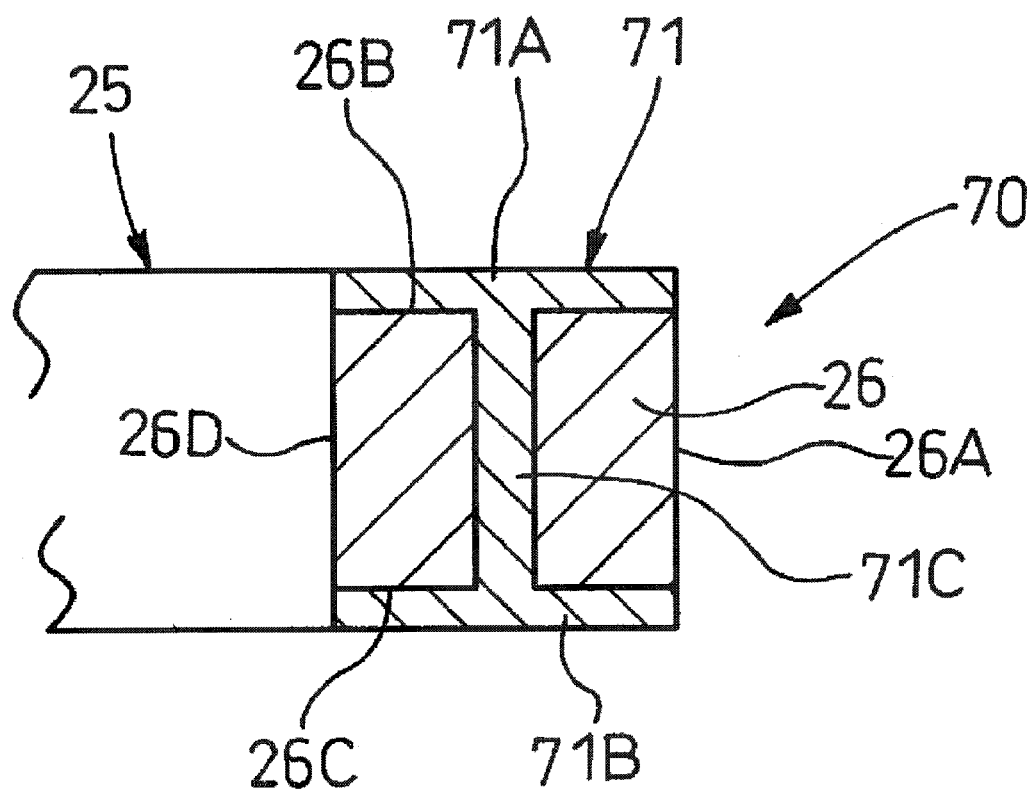
FIG. 6 is a cross-sectional view showing a fifth embodiment of a circuit device according to the present invention.

A circuit device 70 of the fifth embodiment shown in FIG. 6 is configured such that terminal portions 71 are provided in place of the terminal portions 21 in the first embodiment. The circuit device 70 of this embodiment is substantially equal the circuit device 10 of the first embodiment with respect to other constitutions.

Here, the circuit device 70 is not provided with a shield electrode.

Each terminal portion 71 is constituted of a first terminal portion 71A which is connectable to a first circuit pattern 13 of a first printed circuit board 11 (see FIG. 1), a second terminal portion 71B which is connectable to a second circuit pattern 17 of a second printed circuit board 15 (see FIG. 1), and a connecting portion 71C which connects a center portion of the first terminal portion 71A and a center portion of the second terminal portion 71B with each other thus forming an approximately H shape.

The first terminal portions 71A are formed on an upper surface 2613 of the first beam member 26 by plating. The second terminal portions 71B are formed on a lower surface 26C of the first beam member 26 by plating. The connecting portions 71C are formed by plating such that the connecting portions 71C penetrate a center portion of the first beam member 26.

The terminal portions 71 are formed using a material such as gold plating, copper plating or nickel in the same manner as the terminal portions 21.

The circuit device 7 of the fifth embodiment can acquire advantageous effects substantially equal to the advantageous effects of the circuit device 10 of the first embodiment.

In addition to such advantageous effects, according to the circuit device 70 of the fifth embodiment, the connecting portions 71C are formed such that the connecting portions 71C penetrate the center portion of the first beam member 26 and hence, the circuit device 70 exhibits strong resistance against oxidation, corrosion, impact, flaws and the like from the outside thus enhancing durability thereof.

Here, shapes and sizes of the connecting member, the frame body the terminal portion, the first terminal portion, the second terminal portion, the connecting portion, the projecting portion, and the shield electrode exemplified in the above-mentioned first to fifth embodiments can be suitably changed.

INDUSTRIAL APPLICABILITY

The present invention is preferably applicable to a circuit device which interposes a connecting member between a first printed circuit board and a second printed circuit board, and electrically connects the first printed circuit board and the second printed circuit board by terminal portions formed on the connecting member, a manufacturing method of the circuit device, and the connecting member.

The invention claimed is:

1. A circuit device comprising:
    a first printed circuit board and a second printed circuit board which are arranged along a thickness direction of the first printed circuit board and the second printed circuit board; and
    a connecting member which is interposed between the first printed circuit board and the second printed circuit board, the connecting member including an opening extending through the connecting member from a side adjacent the first printed circuit board to a side adjacent the second printed circuit board,
    the first printed circuit board and the second printed circuit board being electrically connected with each other by terminal portions formed on a frame body of the connecting member,
    wherein each of the terminal portions is constituted of a first terminal portion which is connectable to a circuit pattern of the first printed circuit board, a second terminal portion which is connectable to a circuit pattern of the second printed circuit board, and a connecting portion which connects the first terminal portion and the second terminal portion, the first terminal portion and the second terminal portion and the connecting portion forming a U-shaped cross section, the connecting portion located within the opening, and a shield electrode is formed on a side surface of the frame body that is opposite to the connecting portion and is perpendicular to the thickness direction of the first printed circuit board and the second printed circuit board.

2. The circuit device according to claim 1, wherein the frame body is substantially rectangular, and the shield electrode is provided on an outer side surface of the frame body, and the connecting portion is provided on an inner side surface of the frame body.

3. The circuit device according to claim 1, wherein the frame body is provided with a projecting portion on the outer side surface of the frame body and the shield electrode is formed on the projecting portion.

4. The circuit device according to claim 1, wherein the shield electrode is electrically isolated from both the first terminal portion and the second terminal portion.

5. A connecting member which is interposed between a first printed circuit board and a second printed circuit board which are arranged along a thickness direction of the first printed circuit board and the second printed circuit board, and is capable of electrically connecting the first printed circuit board and the second printed circuit board by terminal portions formed on a frame body, and includes an opening extending through the connecting member from a side capable of being placed adjacent the first printed circuit board to a side capable of being placed adjacent the second printed circuit board, wherein, each of the terminal portions is constituted of a first terminal portion which is connectable to a circuit pattern of the first printed circuit board, a second terminal portion which is connectable to a circuit pattern of the second printed circuit board, and a connecting portion which connects the first terminal portion and the second terminal portion, the first terminal portion and the second terminal portion and the connecting portion forming a U-shaped cross section, the connecting portion located within the opening, and a shield electrode is formed on a side surface of the frame body that is opposite to the connecting portion and is perpendicular to the thickness direction of the first printed circuit board and the second printed circuit board.

6. The connecting member according to claim 5, wherein the frame body is provided with a projecting portion on the outer side surface of the frame body and the shield electrode is formed on the projecting portion.

7. The connecting member according to claim 5, wherein the shield electrode is electrically isolated from both the first terminal portion and the second terminal portion.

* * * * *